United States Patent
Park et al.

(10) Patent No.: US 12,009,292 B2
(45) Date of Patent: Jun. 11, 2024

(54) METAL-INSULATOR-METAL (MIM) CAPACITOR STRUCTURE FOR LAYER COUNT REDUCTION AND LOWER CAPACITANCE VARIATION

(71) Applicant: QUALCOMM Incorporated, San Diego, CA (US)

(72) Inventors: Nosun Park, Incheon (KR); Changhan Hobie Yun, San Diego, CA (US); Daniel Daeik Kim, San Diego, CA (US); Paragkumar Ajaybhai Thadesar, San Diego, CA (US); Sameer Sunil Vadhavkar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 235 days.

(21) Appl. No.: 17/547,093

(22) Filed: Dec. 9, 2021

(65) Prior Publication Data
US 2023/0187340 A1      Jun. 15, 2023

(51) Int. Cl.
*H01L 23/522* (2006.01)
*H01L 49/02* (2006.01)

(52) U.S. Cl.
CPC ...... *H01L 23/5223* (2013.01); *H01L 23/5227* (2013.01); *H01L 28/10* (2013.01); *H01L 28/40* (2013.01)

(58) Field of Classification Search
CPC ............. H01L 23/5223; H01L 23/5227; H01L 23/5226; H01L 24/13; H01L 28/86; H01L 28/10; H01L 28/40
See application file for complete search history.

(56) References Cited

U.S. PATENT DOCUMENTS

| | | |
|---|---|---|
| 6,590,473 B1 | 7/2003 | Seo et al. |
| 2002/0123159 A1* | 9/2002 | Chi .......... H01L 27/08 |
| | | 257/E21.022 |
| 2004/0110355 A1 | 6/2004 | Hsieh |
| 2004/0145855 A1* | 7/2004 | Block ........ H01L 23/5286 |
| | | 257/E21.018 |
| 2011/0115050 A1 | 5/2011 | Lin |
| 2019/0081607 A1 | 3/2019 | Velez et al. |

OTHER PUBLICATIONS

International Search Report and Written Opinion—PCT/US2022/044930—ISA/EPO—dated Dec. 20, 2022.

\* cited by examiner

*Primary Examiner* — Nelson Garces
(74) *Attorney, Agent, or Firm* — Seyfarth Shaw LLP

(57) ABSTRACT

An integrated circuit (IC) includes a substrate and a first metal-insulator-metal (MIM) capacitor. The first MIM capacitor includes a first plate comprising a first metallization layer on a surface of the substrate. The first MIM capacitor also includes a first MIM insulator layer on a first portion of a surface of the first plate, a sidewall of the first plate, and a first portion of the surface of the substrate. The first MIM capacitor further includes a second plate on the first MIM insulator layer and on a second portion of the surface of the substrate, the second plate comprising a second metallization layer. The IC also includes an inductor comprising a portion of the second plate on the second portion of the surface of the substrate.

18 Claims, 10 Drawing Sheets

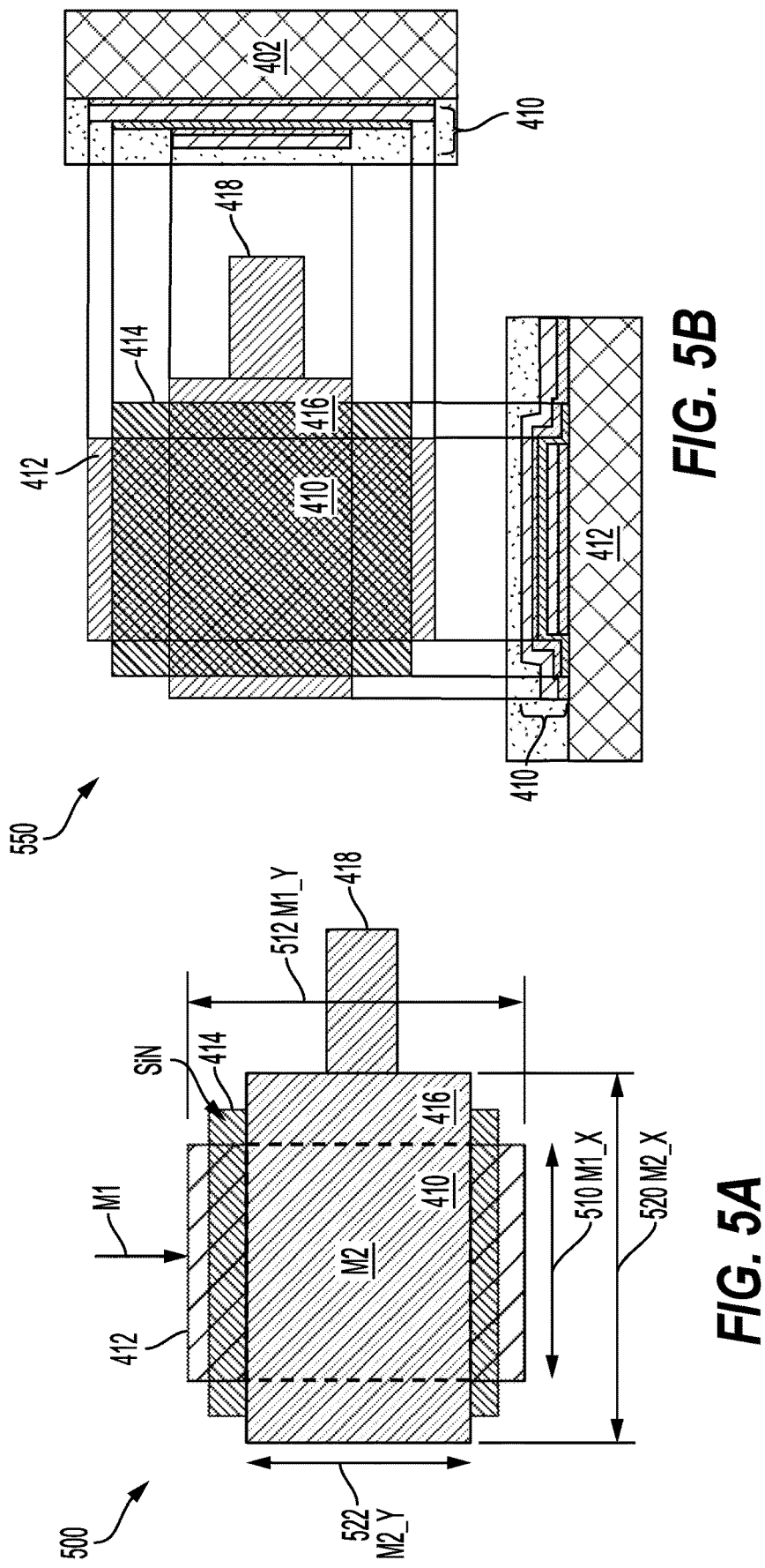

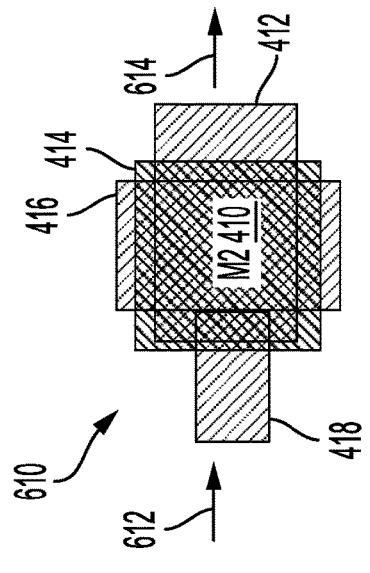
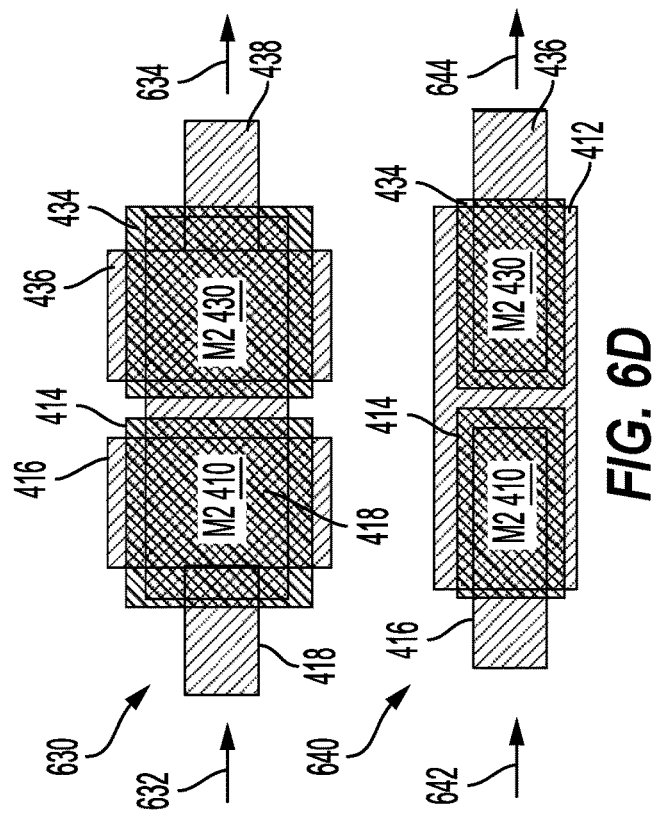
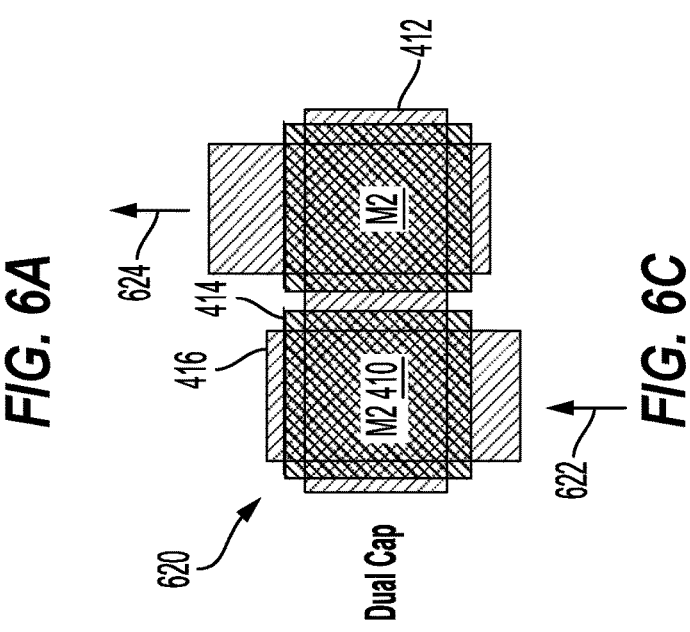
FIG. 6A
FIG. 6B
FIG. 6C
FIG. 6D

METAL-INSULATOR-METAL (MIM) CAPACITOR STRUCTURE FOR LAYER COUNT REDUCTION AND LOWER CAPACITANCE VARIATION

BACKGROUND

Field

Aspects of the present disclosure relate to semiconductor devices and, more particularly, to a metal-insulator-metal (MIM) capacitor structure for layer count reduction and lower capacitance variation.

Background

Wireless communications devices incorporate radio frequency (RF) modules that facilitate the communication and features users expect. As wireless systems become more prevalent and include more capabilities, the chips become more complex. Fifth generation (5G) new radio (NR) wireless communications devices incorporate the latest generation of electronic dies that are packed into smaller modules with smaller interconnections. Design challenges include using passive devices that directly affect analog RF performance considerations, including mismatch, noise, and RF performance.

Passive devices may involve high performance capacitor and inductor components. For example, analog integrated circuits use various types of passive devices, such as integrated capacitors and inductors. The integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures.

The design of mobile RF transceivers may include MIM capacitors and inductors. Some processes specify nine layers to form the inductors and capacitors. In particular, conventional passive on glass (POG) manufacturing uses four metal layers, three passivation layers, one insulation layer, and one under bump metallization layer for a bump. The POG manufacturers may use one or two metal layers for their wafer level products. Unfortunately, a surface topology of nine layers may increase the process cost and the yield drop caused by high warpage due to the nine layers. A MIM capacitor structure with a layer count reduction and lower capacitance variation is desired.

SUMMARY

An integrated circuit (IC) includes a substrate and a first metal-insulator-metal (MIM) capacitor. The first MIM capacitor includes a first plate comprising a first metallization layer on a surface of the substrate. The first MIM capacitor also includes a first MIM insulator layer on a first portion of a surface of the first plate, a sidewall of the first plate, and a first portion of the surface of the substrate. The first MIM capacitor further includes a second plate on the first MIM insulator layer and on a second portion of the surface of the substrate, the second plate comprising a second metallization layer. The IC also includes an inductor comprising a portion of the second plate on the second portion of the surface of the substrate.

A method for fabricating an integrated circuit (IC) is described. The method includes depositing a first metallization layer on a surface of a substrate as a first plate of a first metal-insulator-metal (MIM) capacitor. The method also includes depositing a first MIM insulator layer on a first portion of a surface of the first plate, a sidewall of the first plate, and a first portion of the surface of the substrate. The method further includes depositing a second metallization layer on the first MIM insulator layer and on a second portion of the surface of the substrate as a second plate of the first MIM capacitor. The method also includes forming an inductor comprising a portion of the second plate on the second portion of the surface of the substrate.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying FIGURES. It is to be expressly understood, however, that each of the FIGURES is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5A and 5B are block diagrams further illustrating the cross-type MIM capacitors of FIGS. 4A and 4B, according to aspects of the present disclosure.

FIGS. 6A to 6D are block diagrams further illustrating top views of the cross-type MIM capacitors of FIGS. 4A and 4B in different interconnection schemes, according to aspects of the present disclosure.

DETAILED DESCRIPTION

Figure 1:
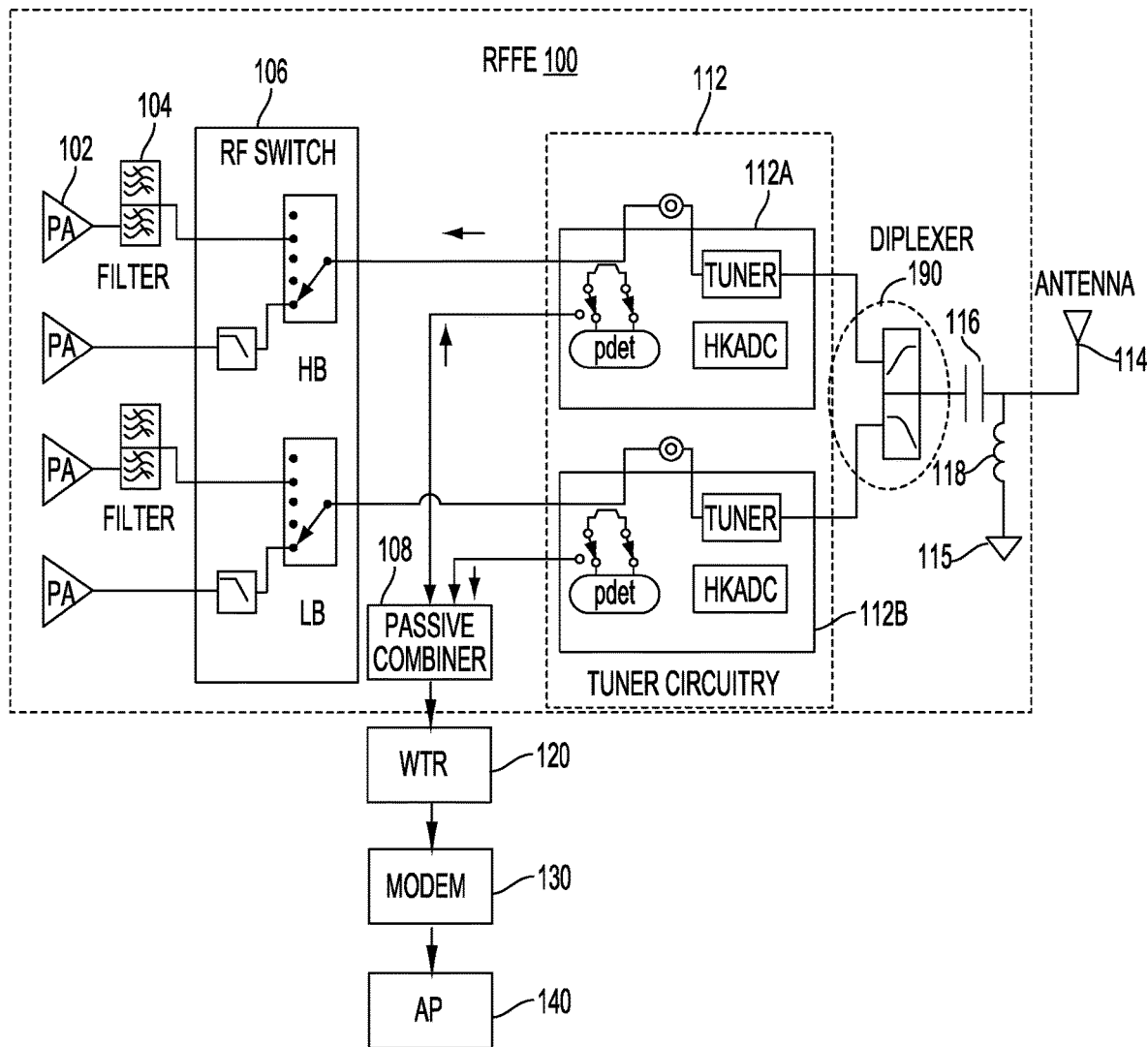
FIG. 1 is a schematic diagram of a radio frequency front-end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers is complicated by added circuit functions for supporting communication enhancements, such as fifth generation (5G) new radio (NR) communications systems. Further design challenges for mobile RF transceivers include using passive devices, which directly affect analog RF performance considerations, including mismatch, noise, and other performance considerations.

Passive devices in mobile radio frequency (RF) transceivers may include high performance capacitor and inductor components. For example, analog integrated circuits use various types of passive devices, such as integrated capacitors and integrated inductors. Integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at millimeter wave (mmW) frequencies (e.g., frequency range two (FR2)).

A radio frequency front-end (RFFE) module may include a 5G broadband FR2 filter including MIM capacitors and inductors. A conventional process of record (POR) specifies nine layers to form the inductors and capacitors. In particular, conventional passive on glass (POG) manufacturing uses four metal layers, three passivation layers, one insulation layer, and one under bump metallization layer for a bump to form the inductors and the capacitors. The POG manufacturers use one or two metal layers for their wafer level products. Unfortunately, a surface topology of the nine layers used to fabricate the inductors and capacitors may increase the process cost and the yield drop caused by high warpage due to the nine layers. A MIM capacitor structure with a layer count reduction and lower capacitance variation is desired.

Various aspects of the disclosure provide an improved MIM capacitor structure having a reduced layer count and a lower capacitance variation. The process flow for fabrication of the capacitor structure may include front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

As described, the back-end-of-line (BEOL) interconnect layers may refer to the conductive interconnect layers (e.g., a first interconnect layer (M1) or metal one M1, metal two (M2), metal three (M3), metal four (M4), etc.) for electrically coupling to front-end-of-line (FEOL) active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to middle-of-line (MOL) interconnect layers, for example, to connect M1 to an oxide diffusion (OD) layer of an integrated circuit. The MOL interconnect layer may include a zero interconnect layer (M0) for connecting M1 to an active device layer of an integrated circuit. A BEOL first via (V2) may connect M2 to M3 or others of the BEOL interconnect layers.

According to aspects of the present disclosure, an integrated circuit is configured with a capacitor according to a cross-type capacitor design. In some configurations, the integrated circuit includes a metal-insulator-metal (MIM) capacitor. A first MIM capacitor includes a first plate composed of a first metallization layer on a surface of a substrate. The first MIM capacitor also includes a first MIM insulator layer on a first portion of a surface of the first plate, a sidewall of the first plate, and a first portion of the surface of the substrate. The first MIM capacitor further includes a second plate on the first MIM insulator layer and on a second portion of the surface of the substrate. The second plate is composed of a second metallization layer.

In some configurations, the integrated circuit also includes an inductor composed of a portion of the second plate on the second portion of the surface of the substrate. The integrated circuit also includes a first via coupled to the portion of the second plate on the second portion of the surface of the substrate. In these configurations, the inductor is further composed of the first via and a third metallization layer on the first via. The integrated circuit further includes a second MIM capacitor. The second MIM capacitor includes the first plate on the surface of the substrate, and a second MIM insulator layer on the surface of the first plate. The second MIM capacitor includes a second, second plate on the second MIM insulator layer on a second portion of the first plate.

FIG. 1 is a schematic diagram of a radio frequency front-end (RFFE) module 100 employing passive devices including a capacitor 116 (e.g., a cross-type metal-insulator-metal (MIM) capacitor). The RFFE module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RFFE module 100.

The radio frequency front-end (RFFE) module 100 also includes tuner circuitry 112 (e.g., first tuner circuitry 112A and second tuner circuitry 112B), the diplexer 190, the capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog-to-digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 190 is between the tuner component of the tuner circuitry 112 and the capacitor 116 (e.g., a cross-type metal-insulator-metal (MIM) capacitor), the inductor 118, and the antenna 114. The diplexer 190 may be placed between the antenna 114 and the tuner circuitry 112 to provide high system performance from the radio frequency front-end (RFFE) module 100 to a chipset including the wireless transceiver 120, the modem 130, and the application processor 140. The diplexer 190 also performs frequency domain multiplexing on both high band frequencies and low band frequencies. After the diplexer 190 performs its frequency multiplexing functions on the input signals, the output of the diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
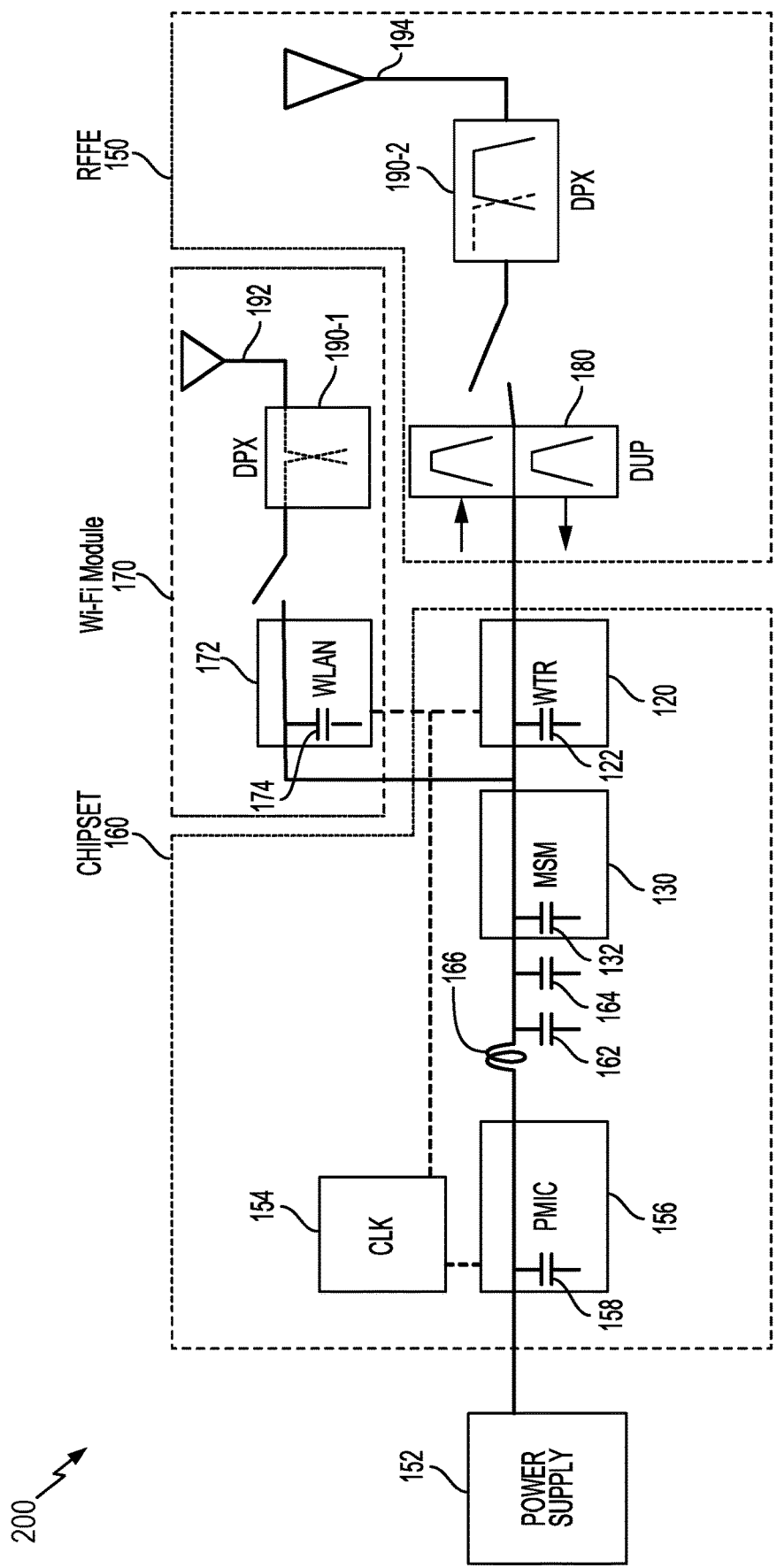
FIG. 2 is a schematic diagram of a radio frequency front-end (RFFE) module employing passive devices for a chipset.

FIG. 2 is a schematic diagram of a radio frequency integrated circuit (RFIC) chip 200, having a wireless local area network (WLAN) (e.g., Wi-Fi) module 170 including a first diplexer 190-1 and a radio frequency front-end (RFFE) module 150 including a second diplexer 190-2 for a chipset 160), including cross-type metal-insulator-metal (MIM) capacitors. The Wi-Fi module 170 includes the first diplexer 190-1 communicably coupling an antenna 192 to a wireless local area network module (e.g., WLAN module 172). The RFFE module 150 includes the second diplexer 190-2 communicably coupling an antenna 194 to a wireless transceiver (WTR) 120 through a duplexer 180. The wireless transceiver 120 and the WLAN module 172 of the Wi-Fi module 170 are coupled to a modem (mobile station modem (MSM), e.g., baseband modem) 130 that is powered by a power supply 152 through a power management integrated circuit (PMIC) 156. The chipset 160 also includes capacitors 162 and 164, as well as an inductor(s) 166 to provide signal integrity.

The power management integrated circuit (PMIC) 156, the modem 130, the wireless transceiver 120, and the wireless local area network (WLAN) module 172 each include capacitors (e.g., 158, 132, 122, and 174) and operate according to a clock 154. In addition, the inductor 166 couples the modem 130 to the PMIC 156. The design of the radio frequency integrated circuit (RFIC) chip 200 includes metal-insulator-metal (MIM) capacitors configured with cross-type MIM capacitors, according to aspects of the present disclosure.

Figure 3:
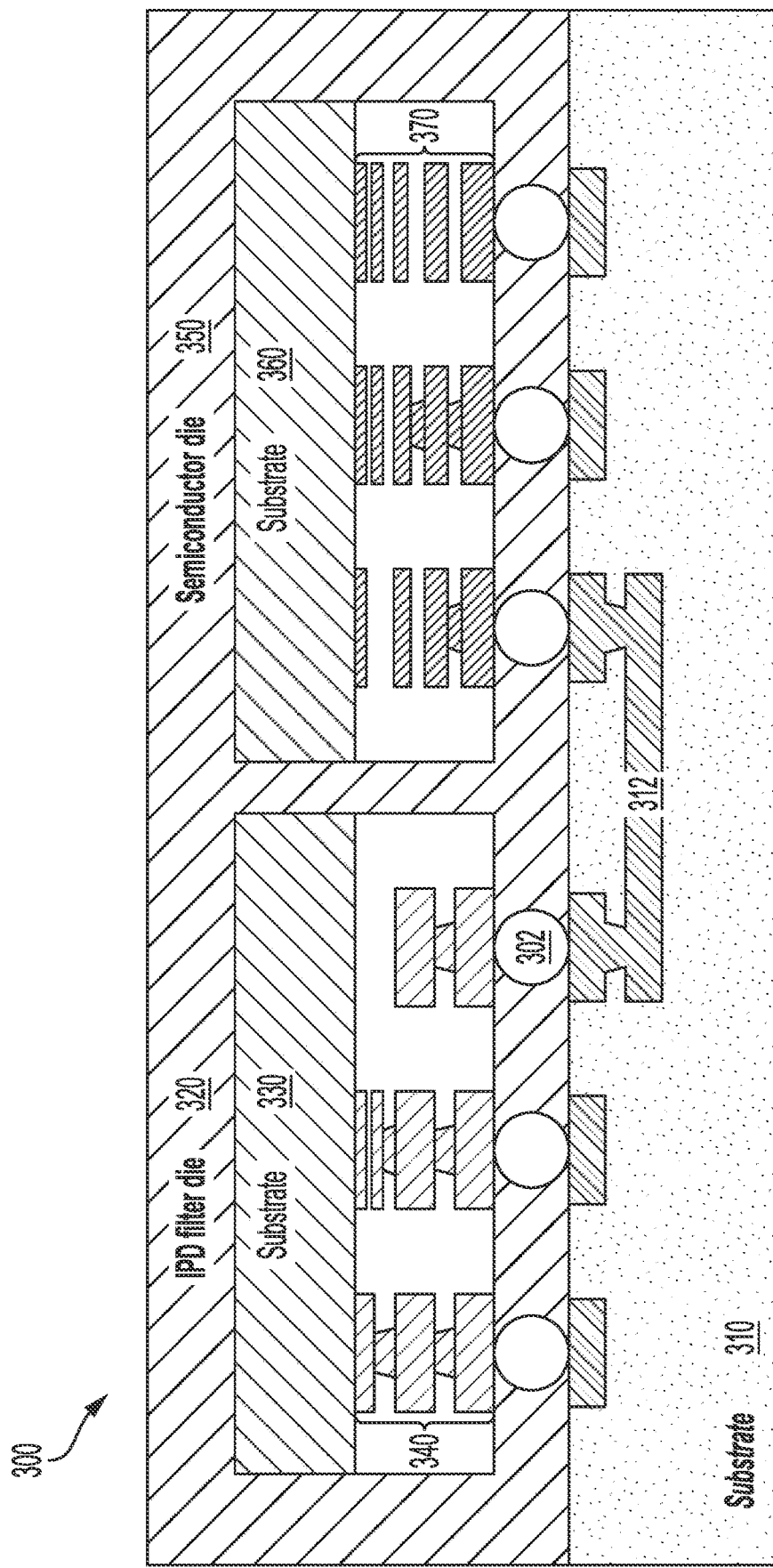
FIG. 3 is a block diagram illustrating a cross-sectional view of a radio frequency front-end (RFFE) module including a semiconductor die and an integrated passive device (IPD) filter die, in accordance with aspects of the present disclosure.

FIG. 3 is a block diagram illustrating a cross-sectional view of a radio frequency front-end (RFFE) module 300 including a semiconductor die and an integrated passive device (IPD) filter die, in accordance with aspects of the present disclosure. In this example, the RFFE module 300 includes a semiconductor die 350 and an IPD filter die 320 supported by a substrate 310. The semiconductor die 350 may be an active die having a semiconductor substrate 360 (e.g., an active silicon substrate) coupled to package balls 302 through back-end-of-line (BEOL) layers 370. The BEOL layers 370 include multiple BEOL metallization layers (M1, M2, M3, . . . , Mn) on the semiconductor substrate 360 (e.g., a diced silicon wafer). A redistribution layer 312 is coupled to the package balls 302.

The IPD filter die 320 includes a substrate 330 (e.g., a passive substrate) coupled to the package balls 302 through back-end-of-line (BEOL) layers 340. The redistribution layer 312 is coupled to the IPD filter die 320 through the package balls 302. In some aspects of the present disclosure, the substrate 330 is composed of glass, and the IPD filter die 320 is a glass-substrate integrated passive device (GIPD) filter die. The IPD filter die 320 may implement a fifth generation (5G) new radio (NR) broadband frequency range two (FR2) filter. According to aspects of the present disclosure, the IPD filter die 320 includes a cross-type metal-insulator-metal (MIM) capacitor interconnected with an inductor, as further illustrated in FIG. 4.

FIGS. 4A-4D are block diagrams illustrating radio frequency integrated circuit (RFIC) chips including a cross-type metal-insulator-metal (MIM) capacitor, according to aspects of the present disclosure. Representatively, an RFIC chip 400 includes a first MIM capacitor 410 and a second MIM capacitor 430, in which the first MIM capacitor 410 is implemented using a cross-type MIM capacitor structure. In this example, the first MIM capacitor 410 and the second MIM capacitor 430 are formed using plates of the M1 and M2 metallization layers, below the metallization layer M3.

In aspects of the present disclosure, the first MIM capacitor 410 includes a first plate 412 composed of a first metallization layer M1 on a surface of a substrate 402 (e.g., a wafer). The first MIM capacitor 410 also includes a first MIM insulator layer 414 on a first portion of a surface of the first plate 412, a sidewall 413 of the first plate 412, and a first portion 404 of the surface of the substrate 402. The first MIM capacitor 410 further includes a second plate 416 on the first MIM insulator layer 414 and on a second portion 406 of the surface of the substrate 402. The second plate 416 is composed of a second metallization layer M2.

Figure 4A:
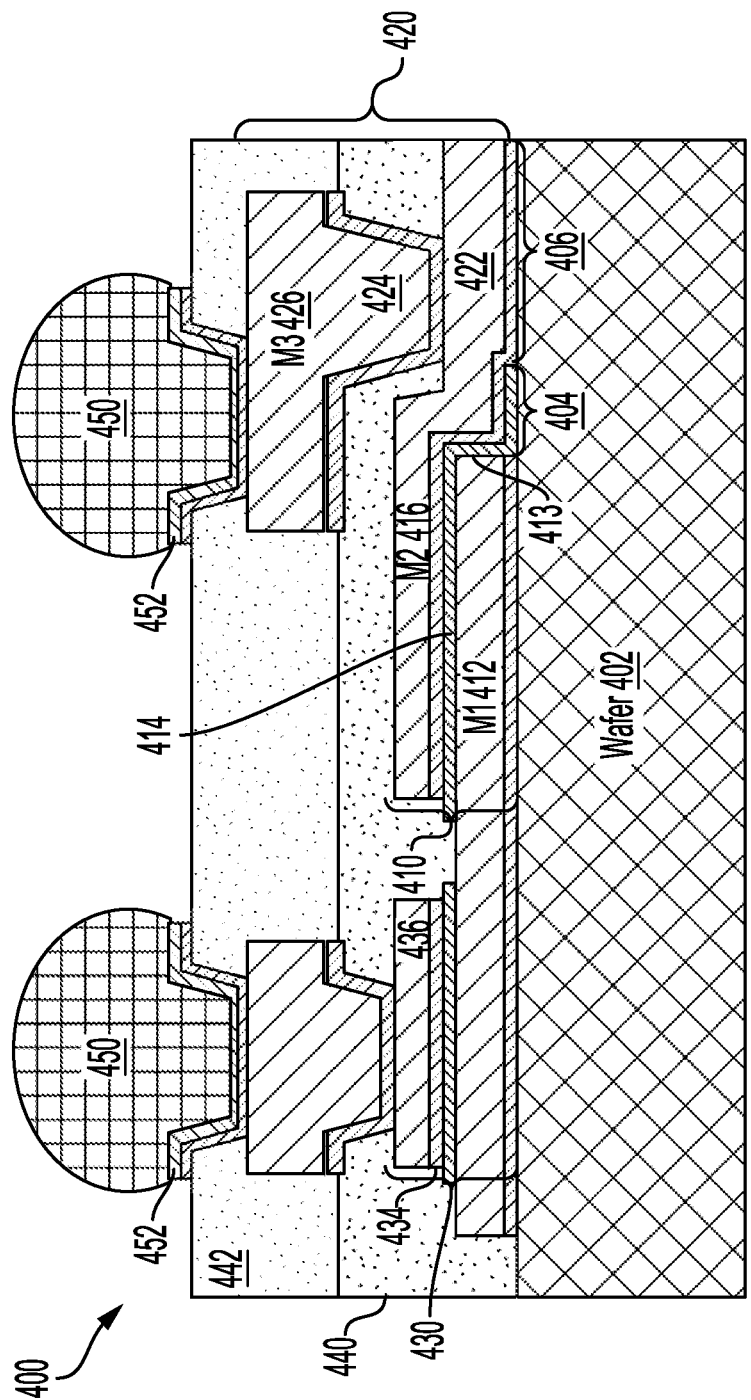
FIGS. 4A-4D are block diagrams illustrating a radio frequency integrated circuit (RFIC) chip including a cross-type metal-insulator-metal (MIM) capacitor, according to aspects of the present disclosure.

As shown in FIG. 4A, the RFIC chip 400 further includes an inductor 420 composed of an inductor interconnection portion 422 of the second plate 416 on the second portion 406 of the surface of the substrate 402. The RFIC chip 400 also includes a first via 424 coupled to the inductor interconnection portion 422 of the second plate 416 on the second portion 406 of the surface of the substrate 402. In this configuration, the inductor 420 is further composed of the first via 424 and a third metallization layer M3 426 on the first via 424. The RFIC chip 400 includes a second MIM capacitor 430. The second MIM capacitor 430 includes the first plate 412 on the surface of the substrate 402, and a second MIM insulator layer 434 on the surface of the first plate 412. The second MIM capacitor 430 also includes a second plate 436 (e.g., a second, second plate) on the second MIM insulator layer 434 on a second portion of the first plate 412. The RFIC chip 400 further includes bump interconnects 450 coupled to the third metallization layer M3 426 through an under bump metallization (UBM) layer 452. In addition, the RFIC chip 400 includes a first passivation layer 440 and a second passivation layer 442.

As previously noted, a conventional process of record (POR) specifies nine layers to form the inductor 420, the first MIM capacitor 410, and the second MIM capacitor 430. In particular, conventional passive on glass (POG) manufacturing uses four metal layers, three passivation layers, one insulation layer, and one under bump metallization (UBM) layer 452 for the bump interconnects 450 to form the inductor 420, the first MIM capacitor 410, and the second MIM capacitor 430. Because POG manufacturers use one or two metal layers for their wafer level products, conventional POR surface topology used to fabricate the inductor 420, the first MIM capacitor 410 and the second MIM capacitor 430 may increase the process cost and the yield drop caused by high warpage due to the nine layers.

According to aspects of the present disclosure, the second metallization layer M2 is used to provide both the inductor interconnection portion 422 for the inductor 420 and the second plate 416 of the first MIM capacitor 410 in the cross-type capacitor configuration. This cross-type capacitor structure of the first MIM capacitor 410 provides a layer count reduction and lower capacitance variation relative to the conventional POR. In particular, the cross-type capacitor structure of the first MIM capacitor 410 enables implementation of the inductor 420 using the third metallization layer M3 426, rather than using the fourth metallization layer M4 and a third passivation layer.

Figure 4D:
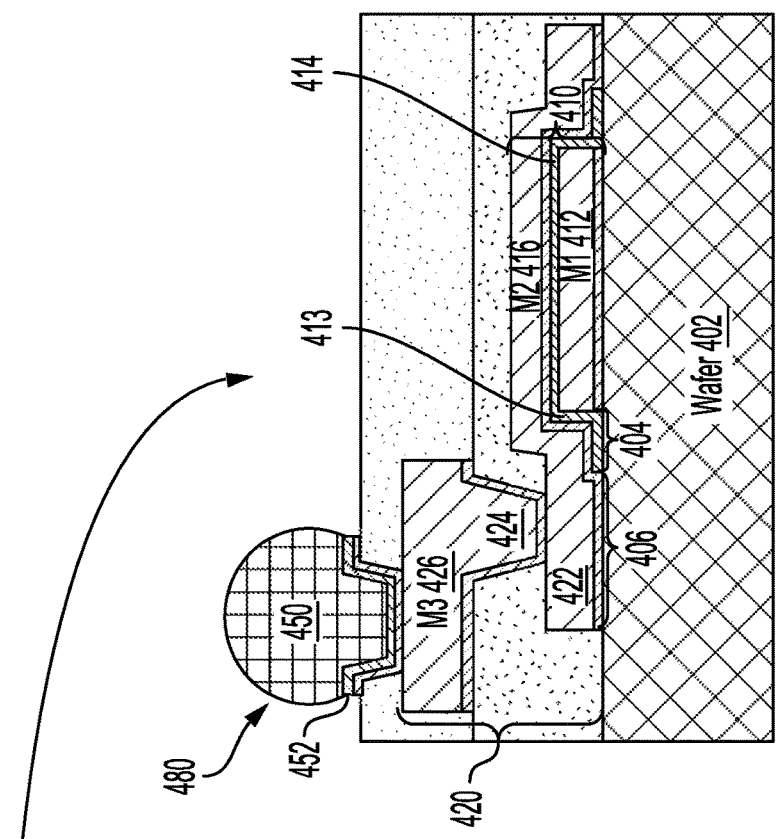
Figure 4B:
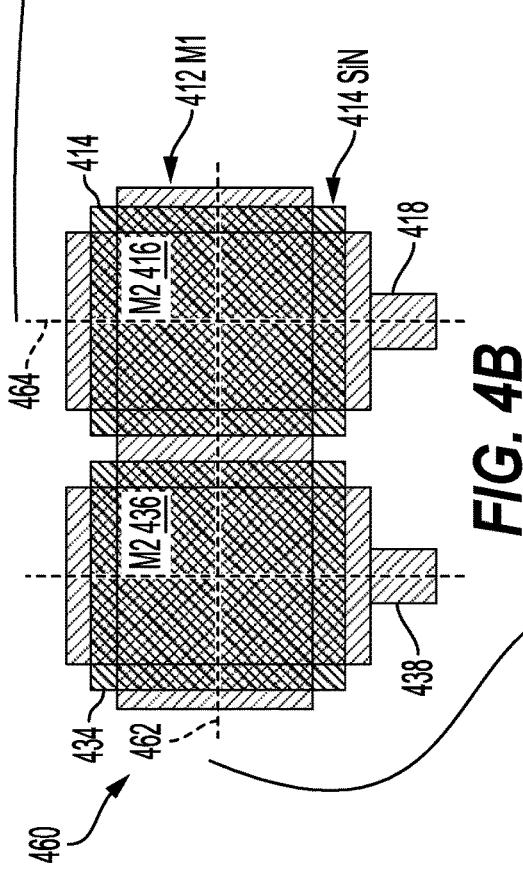

FIG. 4B is a block diagram illustrating a top view 460 of the first MIM capacitor 410 and the second MIM capacitor 430, according to aspects of the present disclosure. In FIG. 4B, the first MIM capacitor 410 and the second MIM capacitor 430 are shown with a contact 418 to the second plate 416 of the first MIM capacitor 410 and a contact 438 to the second plate 436 of the second MIM capacitor 430. In this example, the first MIM insulator layer 414 and the second MIM insulator layer 434 are composed of a dielectric layer, such as silicon nitride (SiN) or other like dielectric material.

Figure 4C:
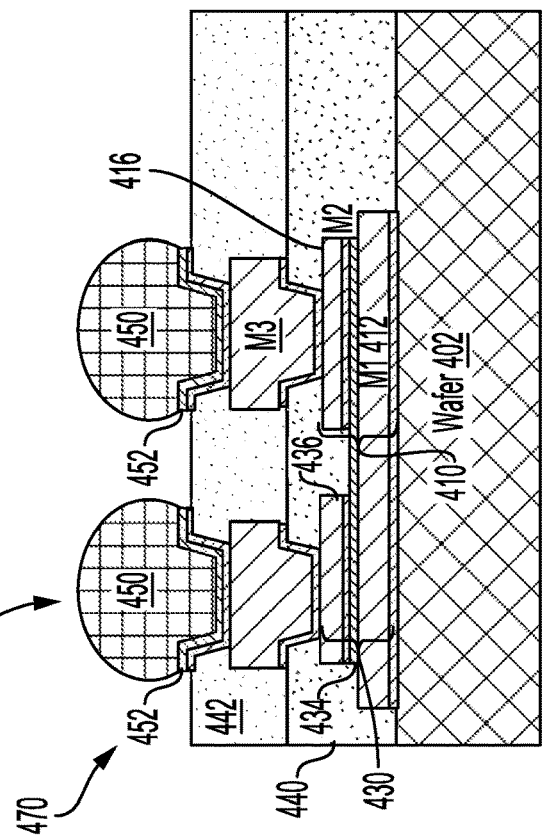

FIG. 4C is a block diagram illustrating a cross-section view 470 along a cut line 462 of the first MIM capacitor 410 and the second MIM capacitor 430, according to aspects of the present disclosure. FIG. 4D is a block diagram illustrating a cross-section view 480 along a cut line 464 of the first MIM capacitor 410, according to aspects of the present disclosure. The cross-section view 480 further illustrates the first via 424 coupled to the inductor interconnection portion 422 of the second plate 416 on the second portion 406 of the surface of the substrate 402. In addition, the inductor 420 is further composed of the first via 424 and the third metallization layer M3 426 on the first via 424.

As shown in FIGS. 4A and 4D, the cross-type capacitor design of the first MIM capacitor 410 uses a shared second metallization layer M2 as the second plate 416 of the first MIM capacitor 410 and the inductor interconnection portion 422. The number of layers in the RFIC chip 400 is reduced by using the third metallization layer M3 426 as a layer of the inductor 420, rather than an inductor interconnection layer for the inductor 420 formed from a fourth metallization layer M4. In some aspects of the present disclosure, a radio frequency (RF) filter is implemented using the inductor 420 and the first MIM capacitor 410 having the first MIM insulator layer 414 on the surface of the first plate 412, the sidewall 413 of the first plate 412, and the first portion 404 of the surface of the substrate 402. In addition, the RF filter includes the second plate 416 on the first MIM insulator layer 414 and the second portion 406 of the substrate 402. A portion of the second metallization layer M2 on the second portion 406 of the substrate 402 provides an inductor interconnection portion 422 for the inductor 420. In some aspects of the present disclosure, a radio frequency (RF) module is implemented using the inductor 420 and the first MIM capacitor 410 using the cross-type capacitor structure.

The implementation of the first MIM capacitor 410 using the second metallization layer M2 for both the second plate 416 and the inductor interconnection portion 422 in the cross-type capacitor structure is beneficial. In aspects of the present disclosure, a layer count reduction of two layers is provided by the cross-type capacitor structure, which can lower the process cost and decrease the accumulative yield loss during passive device fabrication. Other advantages provided by the cross-type capacitor structure include a lower cost (e.g., approximately 15% lower cost), as well as reduced fabrication cycle time (e.g., approximately 17% shorter) relative to the conventional POR. The reduced layer count provided by the MIM cross-type capacitor structure also yields lower warpage. In addition, the lower layer count reduces a thickness of the RFIC chip 400 by ten (10) microns.

FIGS. 5A and 5B are block diagrams further illustrating the cross-type metal-insulator-metal (MIM) capacitors of FIGS. 4A and 4B, according to aspects of the present disclosure. In operation, capacitance of a conventional capacitor according to the process of record (POR) is defined by a second metallization layer M2 critical dimension (CD) size in both the X and the Y-axes. By contrast, for the first MIM capacitor 410, implemented using the cross-type capacitor structure, one side of the first metallization layer M1 and one side of the second metallization layer M2 provide the CD to define the capacitance. This beneficial feature helps reduce a capacitance variation of the first MIM capacitor 410.

As shown in FIG. 5A, the top view 500 illustrates an X-axis width (M1_X) 510 of the first plate 412 and a Y-axis width (M1_Y) 512 of the first plate 412. In addition, an X-axis width (M2_X) 520 of the second plate 416 and a Y-axis width (M2_Y) 522 of the second plate 416 are also shown. FIG. 5B provides a layout view 550 to enable fabrication of the cross-type MIM capacitor of FIG. 5A. The beneficial capacitance variation compensation provided by the first MIM capacitor 410 is further illustrated in Table 1 below.

TABLE I

Capacitor Pad Size Variation

|  | Target: X | Target: Y | Actual: X | Actual: Y | Variation |
|---|---|---|---|---|---|
| POR | M2_X: 100 | M2_Y: 100 | M2_X: 98 | M2_Y: 98 | −4% |
| Cross | M1_X: 100 | M2_Y: 100 | M1_X: 98 | M2_Y: 98 | −4% |
| Type | M1_X: 100 | M2_Y: 100 | M1_X: 100 | M2_Y: 98 | −2% |
|  | M1_X: 100 | M2_Y: 100 | M1_X: 98 | M2_Y: 102 | 0% |

Table I illustrates capacitor pad size variations leading to capacitance variation by comparing a POR capacitor variation and a cross-type capacitor according to aspects of the present disclosure. The POR capacitor has a target width M2_X 520 value of one-hundred (100) microns and an actual width M2_X 520 value of ninety-eight (98) microns. In addition, the POR capacitor has a target width M2_Y 522 value of 100 microns and an actual width M2_Y 522 value of 98 microns. In this example, the difference between the target and actual widths of the second metallization layer M2 results in a 4% capacitance variation for the POR capacitor.

By comparison, the second row of Table 1 shows the cross-type capacitor having a target width M1_X 510 value of 100 microns and an actual width M1_X 510 value of 98 microns. In addition, the cross-type capacitor has a target width M2_Y 522 value of 100 microns and an actual width M2_Y 522 value of 98 microns. In this example, the difference between the target and actual widths of the first metallization layer M1 and the second metallization layer M2 results in a 4% capacitance variation for the cross-type capacitor. This capacitance variation of the cross-type capacitor is the same as the POR capacitor.

By contrast, the third row of Table 1 shows the cross-type capacitor having a target width M1_X 510 value of 100 microns and an actual width M1_X 510 value of 100 microns. In addition, the cross-type capacitor has the target width M2_Y 522 value of 100 microns and an actual width M2_Y 522 value of 98 microns. In this example, the match of the target and actual widths of the first metallization layer M1 and the difference between the target and actual widths of the second metallization layer M2 results in a 2% capacitance variation for the cross-type capacitor. This compensation of the capacitance variation of the cross-type capacitor provides an improvement over the capacitance of the POR capacitor.

Furthermore, the fourth row of Table 1 shows the cross-type capacitor having the target width M1_X 510 value of 100 microns and the actual width M1_X 510 value of 98 microns. In addition, the cross-type capacitor has the target width M2_Y 522 value of 100 microns and an actual width M2_Y 522 value of 102 microns. In this example, the difference between the target and actual widths of the first metallization layer M1 and the difference between the target and actual widths of the second metallization layer M2 offset, resulting in a 0% capacitance variation for the cross-type capacitor. This compensation of the capacitance variation of the cross-type capacitor provides a further improvement over the capacitance of the POR capacitor.

FIG. 5B provides a layout view 550 to enable fabrication of the cross-type MIM capacitor within an RF filter, such as a fifth generation (5G) new radio (NR) broadband frequency range two (FR2) filter of FIG. 3. The layout view 550 of the cross-type capacitor enables conversion of existing filter designs to provide a new design without a change in the die size to incorporate the cross-type capacitor concept described, according to aspects of the present disclosure. In addition, simulation results illustrate RF filter performance when incorporating the cross-type capacitor. Furthermore, the RF filter performance can be precisely matched with a cross-type MIM capacitor during a build stage.

FIGS. 6A to 6D are block diagrams further illustrating top views of the cross-type metal-insulator-metal (MIM) capacitors of FIGS. 4A and 4B in different interconnection schemes, according to aspects of the present disclosure. FIG. 6A illustrates a first, single cross-type MIM capacitor 600, which is described using similar reference numbers to the first MIM capacitor 410 shown in FIGS. 4A and 4B. In this example, an input signal 602 follows a ninety (90)-degree signal flow path through a first, single cross-type MIM capacitor 600 to generate an output signal 604 based on a first interconnection scheme of the first, single cross-type MIM capacitor 600.

FIG. 6B illustrates a second, single cross-type metal-insulator-metal (MIM) capacitor 610 arranged according to a second interconnection scheme, according to aspects of the present disclosure. The second, single cross-type MIM capacitor 610 is also described using similar reference numbers to the first MIM capacitor 410 shown in FIGS. 4A and 4B. In this example, an input signal 612 avoids the 90-degree signal flow path of the first, single cross-type MIM capacitor 600 of FIG. 6A. According to the second interconnection scheme, the signal flow path of the input signal 612 through the second, single cross-type MIM capacitor 610 to generate an output signal 614 provides improved signal integrity relative to the first interconnection scheme of the first, single cross-type MIM capacitor 600 of FIG. 6A.

FIG. 6C illustrates first, dual cross-type metal-insulator-metal (MIM) capacitors 620, which are described using similar reference numbers to the first and second MIM capacitors 410, 430 shown in FIGS. 4A and 4B. In this example, an input signal 622 follows two 90-degree signal flow paths through the first, dual cross-type MIM capacitors 620 to generate an output signal 624 based on a first interconnection scheme of the first, dual cross-type MIM capacitors 620.

FIG. 6D illustrates a second, dual cross-type metal-insulator-metal (MIM) capacitor 630 arranged according to a second interconnection scheme, according to aspects of the present disclosure. The second, dual cross-type MIM capacitor 630 is also described using similar reference numbers to the first MIM capacitor 410 shown in FIGS. 4A and 4B. In this example, an input signal 632 avoids the two 90-degree signal flow paths of the first, single cross-type MIM capacitor 600 of FIG. 6A. According to the second interconnection scheme, the signal flow path of the input signal 632 through the second, dual cross-type MIM capacitor 630 to generate an output signal 634 provides improved signal integrity relative to the first interconnection scheme of the first, single cross-type MIM capacitor 600 of FIG. 6A.

FIG. 6D also illustrates a third, dual cross-type MIM capacitor 640 arranged according to a third interconnection scheme, according to aspects of the present disclosure. The third, dual cross-type MIM capacitor 640 is also described using similar reference numbers to the first MIM capacitor 410 shown in FIGS. 4A and 4B. In this example, an input signal 642 also avoids the two 90-degree signal flow paths of the first, single cross-type MIM capacitor 600 of FIG. 6A. According to the third interconnection scheme, the signal flow path of the input signal 642 through the third, dual cross-type MIM capacitor 640 to generate an output signal 644 provides improved signal integrity relative to the first interconnection scheme of the first, single cross-type MIM capacitor 600 of FIG. 6A. A process for fabrication of a cross-type MIM capacitor structure is shown, for example, in FIG. 7.

Figure 7:
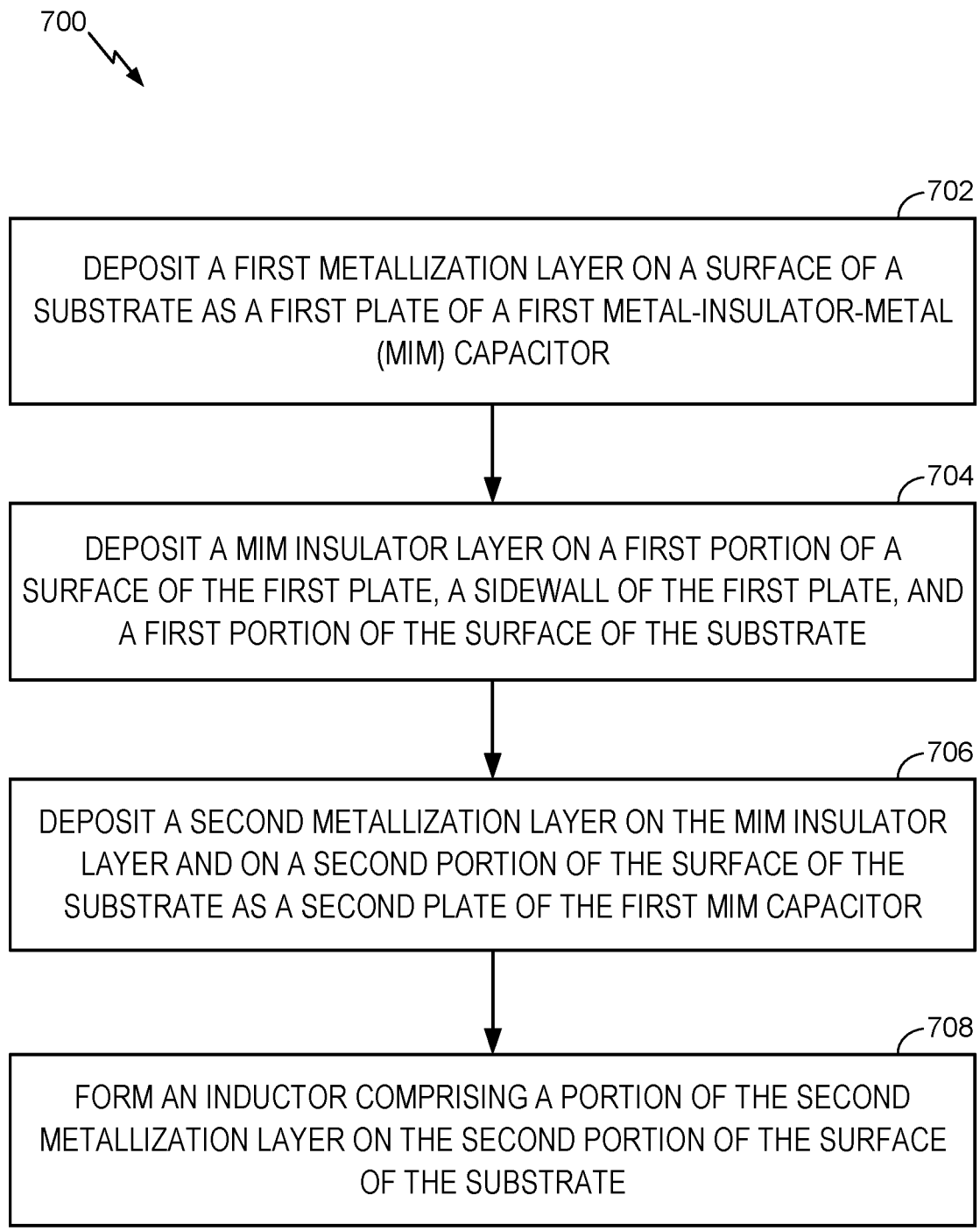
FIG. 7 is a process flow diagram illustrating a method for fabricating a cross-type metal-insulator-metal (MIM) capacitor, according to aspects of the present disclosure.

FIG. 7 is a process flow diagram illustrating a method for fabricating an integrated circuit (IC), according to aspects of the present disclosure. A method 700 begins in block 702, in which a first metallization layer is deposited on a surface of a substrate as a first plate of a first MIM capacitor. For example, as shown in FIG. 4A, the first MIM capacitor 410 includes the first plate 412 composed of the first metallization layer M1 on the surface of the substrate 402. In this example, the first metallization layer M1 on the surface of the substrate 402 provides a shared, first plate of the first MIM capacitor 410 and the second MIM capacitor 430. That is, the second MIM capacitor 430 includes the first metallization layer M1 on the surface of the substrate 402 as a first plate 412.

In block 704, a MIM insulator layer is deposited on a first portion of a surface of the first plate, a sidewall of the first plate, and a first portion of the surface of the substrate. As shown in FIG. 4A, the first MIM capacitor 410 includes the first MIM insulator layer 414 on a first portion 404 of a surface of the first plate 412 to provide an insulator of the first MIM capacitor 410. In the cross-type capacitor structure configuration of FIG. 4A, the first MIM insulator layer 414 is also deposited on the sidewall 413 of the first plate 412 as well as the first portion 404 of the surface of the substrate 402.

Referring again to FIG. 7, at block 706, a second metallization layer is deposited on the MIM insulator layer and on a second portion of the surface of the substrate as a second plate of the first MIM capacitor. For example, as shown in FIG. 4A for the first MIM capacitor 410, the second metallization layer M2 is deposited on the first MIM insulator layer 414 to provide the second plate 416 on the first MIM insulator layer 414. In addition, the second metallization layer M2 is deposited on the second portion 406 of the surface of the substrate 402 to provide the inductor interconnection portion 422. The implementation of the first MIM capacitor 410 using the second metallization layer M2 for both the second plate 416 and the inductor interconnection portion 422 in the cross-type capacitor structure is beneficial.

At block 708, an inductor is formed from a portion of the second metallization layer on the second portion of the surface of the substrate. For example, as shown in FIG. 4A, the RFIC chip 400 further includes the inductor 420 composed of the inductor interconnection portion 422 of the second plate 416 on the second portion 406 of the surface of the substrate 402. The RFIC chip 400 also includes a first via 424 coupled to the inductor interconnection portion 422 of the second plate 416 on the second portion 406 of the surface of the substrate 402. In this configuration, the inductor 420 is further composed of the first via 424 and a third metallization layer M3 426 on the first via 424. The RFIC chip 400 further includes a second MIM capacitor 430.

The method 700 also includes depositing a second passivation layer on the inductor and a first passivation layer on the first MIM capacitor. The method 700 further includes exposing a surface of the inductor through the second passivation layer. The method 700 also includes forming an under bump metallization (UBM) layer on the surface of the inductor and sidewalls and a portion of a surface of the second passivation layer. The method 700 further includes forming a bump interconnect on the UBM layer. For example, as shown in FIG. 4A, The RFIC chip 400 further includes bump interconnects 450 coupled to the third metallization layer M3 426 through an under bump metallization (UBM) layer 452. In addition, the RFIC chip 400 includes a first passivation layer 440 and a second passivation layer 442.

In aspects of the present disclosure, a layer count reduction provided by a MIM cross-type capacitor structure can lower the process cost and decrease the accumulative yield loss during passive device fabrication. In addition, the MIM cross-type capacitor structure may compensate for capacitance variation, which increases a final test yield. Other advantages provided by the MIM cross-type capacitor structure include a lower cost (e.g., approximately 15% lower cost), as well as reduced fabrication cycle time (e.g., approximately 17% shorter) relative to conventional MIM capacitor structures. The reduced layer count provided by the MIM cross-type capacitor structure also yields lower warpage. The MIM cross-type capacitor structure further provides lower capacitance variation, a higher RF test yield (e.g., compensation), as well as a higher process yield, which decreases an accumulative yield loss.

According to a further aspect of the present disclosure, an integrated circuit (IC) includes a metal-insulator-metal (MIM) capacitor. In one configuration, the MIM has means for interconnecting with an inductor. In one configuration, the interconnecting means may be the inductor interconnection portion 422, as shown in FIG. 4. In another aspect, the aforementioned means may be any structure or any material configured to perform the functions recited by the aforementioned means.

Figure 8:
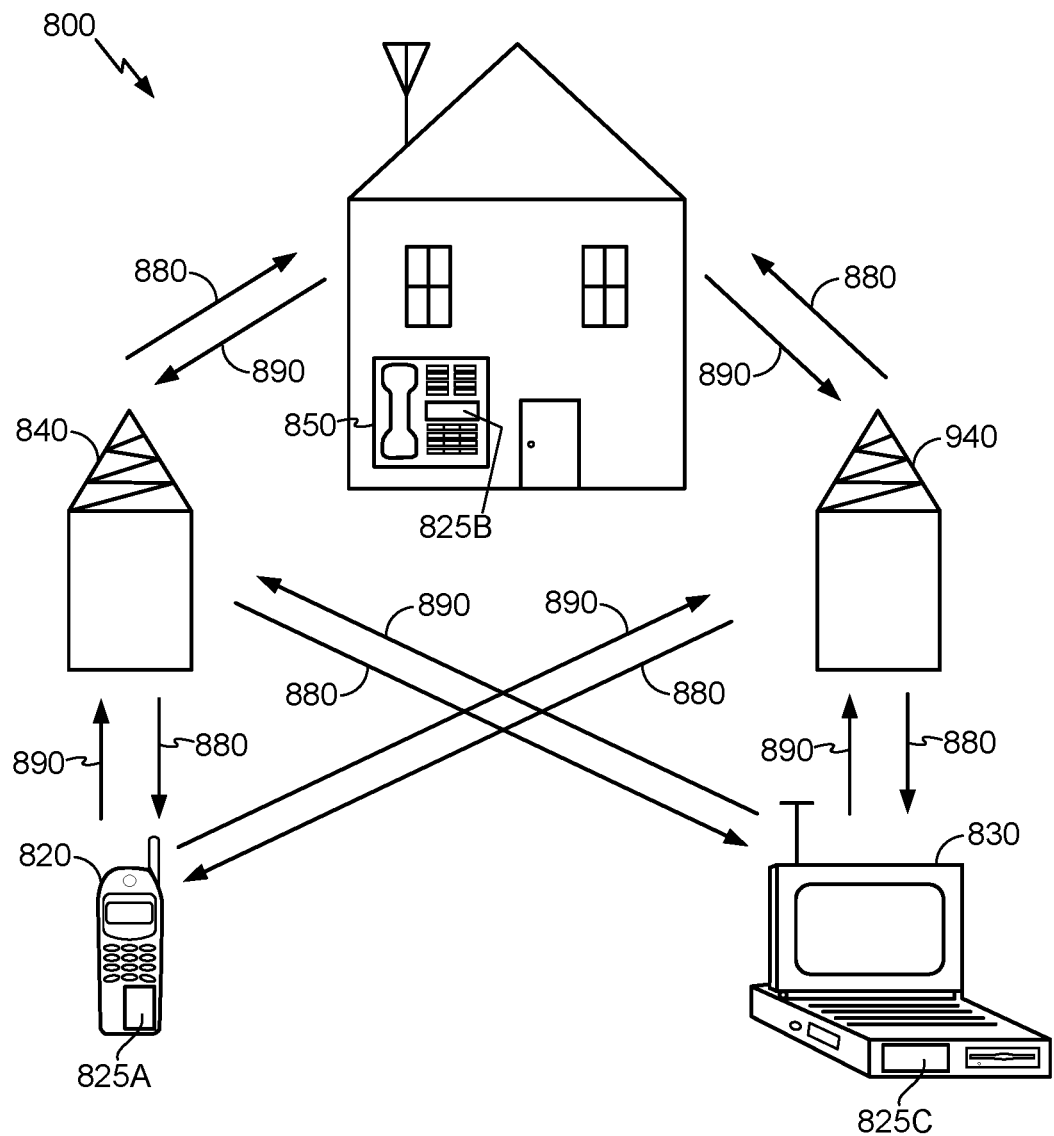
FIG. 8 is a block diagram showing an exemplary wireless communications system in which a configuration of the present disclosure may be advantageously employed.

FIG. 8 is a block diagram showing an exemplary wireless communications system 800 in which an aspect of the disclosure may be advantageously employed. For purposes of illustration, FIG. 8 shows three remote units 820, 830, and 850 and two base stations 840. It will be recognized that wireless communications systems may have many more remote units and base stations. Remote units 820, 830, and 850 include integrated circuit (IC) devices 825A, 825C, and 825B that include the disclosed cross-type capacitor. It will be recognized that other devices may also include the disclosed cross-type capacitors, such as the base stations, switching devices, and network equipment. FIG. 8 shows forward link signals 880 from the base station 840 to the remote units 820, 830, and 850, and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 8 illustrates remote units according to the aspects of the present disclosure, the present disclosure is not limited to these exemplary illustrated units. Aspects of the present disclosure may be suitably employed in many devices, which include the disclosed cross-type capacitors.

Figure 9:
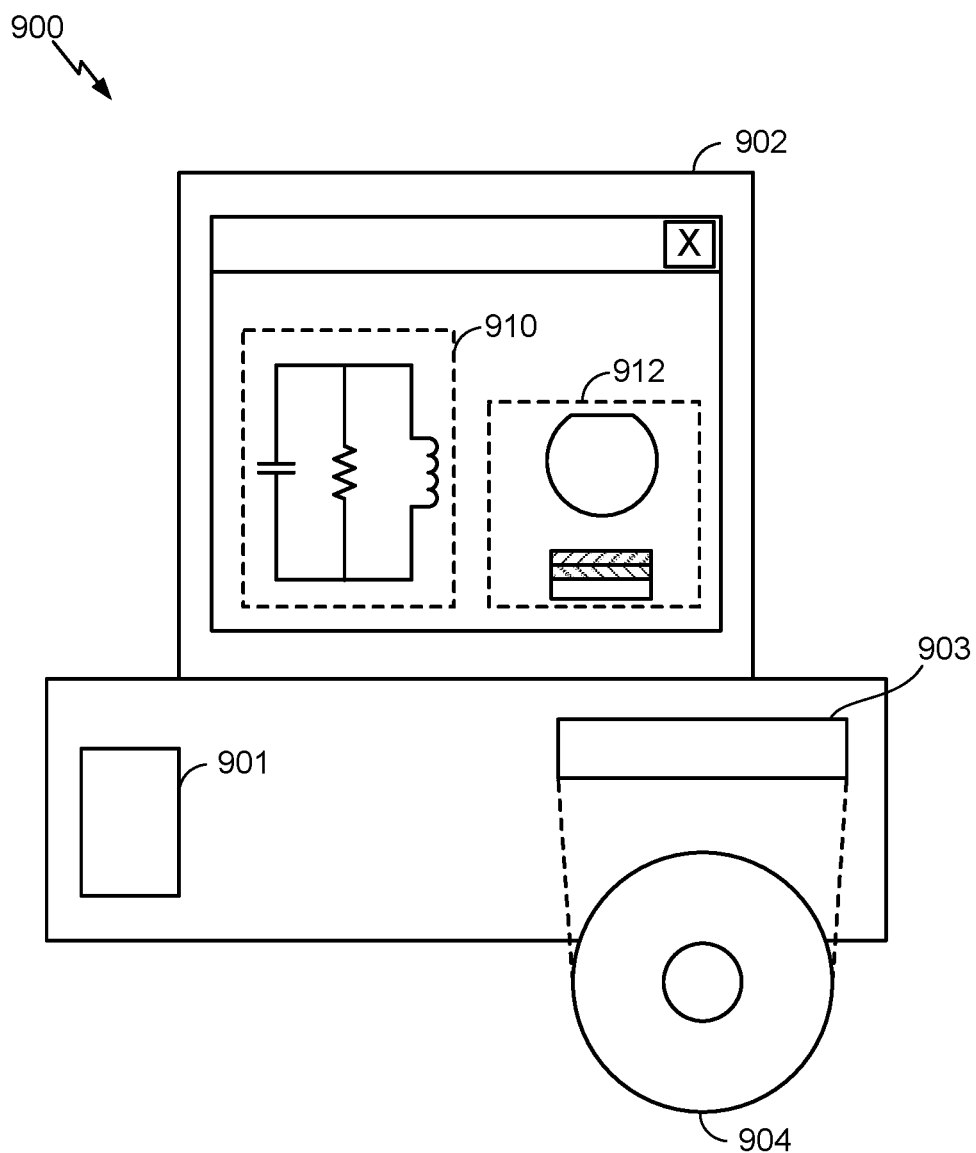
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the capacitors disclosed above. A design workstation 900 includes a hard disk 901 containing operating system software, support files, and design software such as Cadence or OrCAD. The design workstation 900 also includes a display 902 to facilitate design of a circuit 910 or a radio frequency (RF) component 912 such as a cross-type capacitor. A storage medium 904 is provided for tangibly storing the design of the circuit 910 or the RF component 912 (e.g., the cross-type MIM capacitors). The design of the circuit 910 or the RF component 912 may be stored on the storage medium 904 in a file format such as GDSII or GERBER. The storage medium 904 may be a compact disc read-only memory (CD-ROM), digital versatile disc (DVD), hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the radio frequency (RF) component 912 by decreasing the number of processes for designing semiconductor wafers.

Implementation examples are described in the following numbered clauses:

1. An integrated circuit (IC), comprising:
a substrate;
a first metal-insulator-metal (MIM) capacitor comprising:
  a first plate comprising a first metallization layer on a surface of the substrate,
  a first MIM insulator layer on a first portion of a surface of the first plate, a sidewall of the first plate, and a first portion of the surface of the substrate, and
  a second plate on the first MIM insulator layer and on a second portion of the surface of the substrate, the second plate comprising a second metallization layer; and
an inductor comprising a portion of the second plate on the second portion of the surface of the substrate.

2. The IC of clause 1, further comprising a first via coupled to the portion of the second plate on the second portion of the surface of the substrate.

3. The IC of clause 2, in which the inductor further comprises the first via and a third metallization layer on the first via.

4. The IC of any of clauses 1-3, further comprising a second MIM capacitor, which comprises:
the first plate on the surface of the substrate,
a second MIM insulator layer on a second portion of the surface of the first plate; and
a third plate on the second MIM insulator layer.

5. The IC of any of clauses 1-4, in which the second plate is on a sidewall of the first MIM insulator layer and on the first MIM insulator layer on the first portion of the surface of the substrate.

6. The IC of any of clauses 1-5, in which an X-axis width of the second plate is greater than an X-axis width of the first plate.

7. The IC of any of clauses 1-6, in which an X-axis width of the first MIM insulator layer is greater than an X-axis width of the first plate.

8. The IC of claim any of clauses 1-7, in which the IC is integrated in an integrated passive device (IPD).

9. The IC of clause 8, in which the IPD is integrated in a radio frequency (RF) filter.

10. The IC of any of clauses 8-9, in which the IPD is integrated in a radio frequency (RF) module.

11. A method for fabricating an integrated circuit (IC), comprising:
depositing a first metallization layer on a surface of a substrate as a first plate of a first metal-insulator-metal (MIM) capacitor;
depositing a first MIM insulator layer on a first portion of a surface of the first plate, a sidewall of the first plate, and a first portion of the surface of the substrate;
depositing a second metallization layer on the first MIM insulator layer and on a second portion of the surface of the substrate as a second plate of the first MIM capacitor; and
forming an inductor comprising a portion of the second plate on the second portion of the surface of the substrate.

12. The method of clause 11, in which forming the inductor comprising:
forming a first via coupled to the portion of the second plate on the second portion of the surface of the substrate; and
depositing a third metallization layer on the first via.

13. The method of any of clauses 11-12, further comprising:
depositing a first passivation layer on the first MIM capacitor; and
depositing a second passivation layer on the inductor and the first passivation layer.

14. The method of clause 13, further comprising:
exposing a surface of the inductor through the second passivation layer;
forming an under bump metallization (UBM) layer on the surface of the inductor and on sidewalls and a portion of a surface of the second passivation layer; and
forming a bump interconnect on the UBM layer.

15. The method of any of clauses 11-14, further comprising:
forming a second MIM insulator layer on a second portion of the surface of the first plate; and
forming a third plate on the second MIM insulator layer.

16. The method of any of clauses 11-15, in which depositing the second metallization layer comprises depositing the second metallization layer on a sidewall of the first MIM insulator layer and on the first MIM insulator layer on the first portion of the surface of the substrate.

17. The method of any of clauses 11-16, further comprising integrating the IC in an integrated passive device (IPD).

18. The method of clause 17, further comprising integrating the IPD in a radio frequency (RF) filter.

19. The method of any of clauses 17-18, further comprising integrating the IPD in a radio frequency (RF) module.

20. The method of any of clauses 11-19, in which the substrate comprises glass.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. An integrated circuit (IC), comprising:
   a substrate;
   a first metal-insulator-metal (MIM) capacitor comprising:
      a first plate comprising a first metallization layer on a surface of the substrate,
      a first MIM insulator layer on a first portion of a surface of the first plate, a sidewall of the first plate, and a first portion of the surface of the substrate, and
      a second plate on the first MIM insulator layer and on a second portion of the surface of the substrate, the second plate comprising a second metallization layer;
   an inductor comprising a portion of the second plate on the second portion of the surface of the substrate; and
   a second MIM capacitor, which comprises:
      the first plate on the surface of the substrate,
      a second MIM insulator layer on a second portion of the surface of the first plate; and
      a third plate on the second MIM insulator layer.

2. The IC of claim 1, further comprising a first via coupled to the portion of the second plate on the second portion of the surface of the substrate.

3. The IC of claim 2, in which the inductor further comprises the first via and a third metallization layer on the first via.

4. The IC of claim 1, in which the second plate is on a sidewall of the first MIM insulator layer and on the first MIM insulator layer on the first portion of the surface of the substrate.

5. The IC of claim 1, in which an X-axis width of the second plate is greater than an X-axis width of the first plate.

6. The IC of claim 1, in which an X-axis width of the first MIM insulator layer is greater than an X-axis width of the first plate.

7. The IC of claim 1, in which the IC is integrated in an integrated passive device (IPD).

8. The IC of claim 7, in which the IPD is integrated in a radio frequency (RF) filter.

9. The IC of claim 7, in which the IPD is integrated in a radio frequency (RF) module.

10. A method for fabricating an integrated circuit (IC), comprising:
    depositing a first metallization layer on a surface of a substrate as a first plate of a first metal-insulator-metal (MIM) capacitor;
    depositing a first MIM insulator layer on a first portion of a surface of the first plate, a sidewall of the first plate, and a first portion of the surface of the substrate;
    depositing a second metallization layer on the first MIM insulator layer and on a second portion of the surface of the substrate as a second plate of the first MIM capacitor;
    forming an inductor comprising a portion of the second plate on the second portion of the surface of the substrate;
    forming a second MIM insulator layer on a second portion of the surface of the first plate; and
    forming a third plate on the second MIM insulator layer.

11. The method of claim 10, in which forming the inductor comprises:
    forming a first via coupled to the portion of the second plate on the second portion of the surface of the substrate; and
    depositing a third metallization layer on the first via.

12. The method of claim 10, further comprising:
    depositing a first passivation layer on the first MIM capacitor; and
    depositing a second passivation layer on the inductor and the first passivation layer.

13. The method of claim 12, further comprising:
    exposing a surface of the inductor through the second passivation layer;
    forming an under bump metallization (UBM) layer on the surface of the inductor and on sidewalls and a portion of a surface of the second passivation layer; and
    forming a bump interconnect on the UBM layer.

14. The method of claim 10, in which depositing the second metallization layer comprises depositing the second metallization layer on a sidewall of the first MIM insulator layer and on the first MIM insulator layer on the first portion of the surface of the substrate.

15. The method of claim 10, further comprising integrating the IC in an integrated passive device (IPD).

16. Method of claim 15, further comprising integrating the IPD in a radio frequency (RF) filter.

17. The method of claim 15, further comprising integrating the IPD in a radio frequency (RF) module.

18. The method of claim 10, in which the substrate comprises glass.

* * * * *